United States Patent [19]

Weyrich

[11] 3,976,813

[45] Aug. 24, 1976

[54] METHOD OF PRODUCING, METAL CONTACTS WITH LOW ABSORPTION LOSSES ON GALLIUM PHOSPHIDE LUMINESCENCE DIODES

[75] Inventor: Claus Weyrich, Gauting, Germany

[73] Assignee: Siemens Aktiengesellschaft, Berlin & Munich, Germany

[22] Filed: May 30, 1974

[21] Appl. No.: 474,663

[30] Foreign Application Priority Data

June 6, 1973  Germany.............................. 2328905

[52] U.S. Cl.................................... 427/88; 357/68; 357/67
[51] Int. Cl.²...................... B44D 1/18; H01L 23/48
[58] Field of Search ............. 117/212, 227; 357/17, 357/67, 68; 427/88, 87

[56] References Cited
UNITED STATES PATENTS

| | | | |
|---|---|---|---|
| 3,361,592 | 1/1968 | Quetsch, Jr. et al................. | 117/212 |
| 3,684,930 | 8/1972 | Collins et al.......................... | 357/17 |

FOREIGN PATENTS OR APPLICATIONS 2,031,021   4/1971   Germany

*Primary Examiner*—John D. Welsh
*Attorney, Agent, or Firm*—Hill, Gross, Simpson, Van Santen, Steadman, Chiara & Simpson

[57] ABSTRACT

A method of producing an electrical contact, with a low contact resistance, on a semiconductor bodies, particularly for luminescence diodes of semiconductor material, and which is also suitable for securing such a semiconductor body on an electrically conductive body acting as a heat sink, in which small metal contacts arranged in the form of a raster pattern are alloyed at an increased temperature, on the surface of the semiconductor body to be contacted, with the sum of the surface areas of all the metal contacts being small in relation to the surface area of the semiconductor body, and thereafter securing the surface of the semiconductor body, provided with such metal contacts, to a metal heat sink by an electrically and thermally conductive adhesive layer.

4 Claims, 1 Drawing Figure

U.S. Patent  Aug. 24, 1976  3,976,813
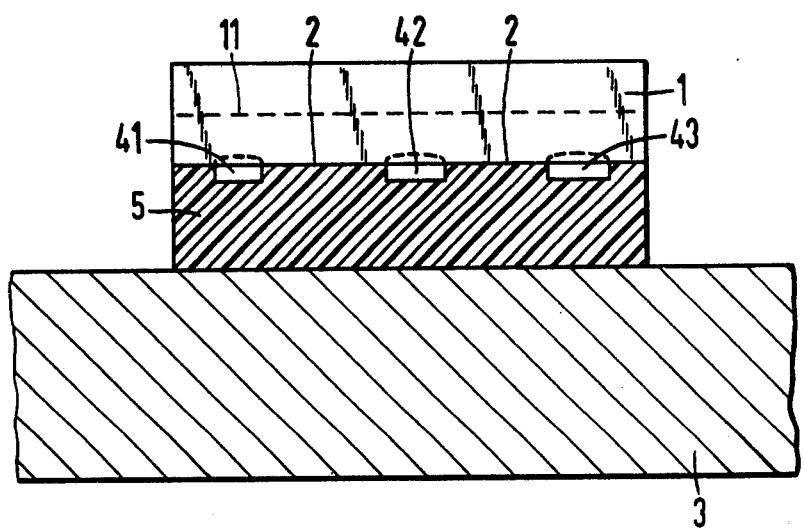

METHOD OF PRODUCING, METAL CONTACTS WITH LOW ABSORPTION LOSSES ON GALLIUM PHOSPHIDE LUMINESCENCE DIODES

BACKGROUND OF THE INVENTION

The invention is directed to a method of producing an electrical contact with low contact resistance on a semiconductor body, which method is, in particular, suitable for luminescence diodes consisting of semiconductor material and which also is suitable to secure the semiconductor body on an electrically conductive body acting as heat sink.

In the past, low resistance contacts applied to luminescence diodes composed of semiconductor material, in particular gallium phosphide, were produced by alloying such contacts at temperatures of approximately 500°C. In this case a cleavage surface of the crystal was alloyed, as a whole, onto the heat sink. In such alloying process the reflective power for the luminescent radiation produced within the semiconductor material was considerably reduced at the boundary surface gallium phosphide-metal contact, so that the light entering the alloy layer was practically completely absorbed therein.

In order to increase the efficiency of luminescence diodes, it would therefore be advantageous to employ metal contacts which are alloyed on small areas and which possess a reflection coefficient as high as possible for the luminescent radiation falling upon such boundary surface. In the production of such contacts, initially a SiO$_2$ layer of approximately 5000 AE was applied to the surface to be alloyed and into such SiO$_2$ layer were etched holes whose total areas formed approximately 10% of the surface to be alloyed-on. Subsequently, metallic contact material was vapour-deposited upon such SiO$_2$ layer and the vaporized semiconductor body was then alloyed, at high temperatures, into the heat sink. The metal contact produced in accordance with this improved method possessed reduced absorption losses, but as a result of the relatively thick SiO$_2$ layer, the heat resistance between the semiconductor body and the heat sink was considerably increased.

The present invention therefore has as its objective the provision of an ohmic contact for luminescence diodes which are to be adhered to a heat sink, in which the contact exhibits low absorption losses and in addition thereto a low heat resistance.

BRIEF SUMMARY OF THE INVENTION

The objectives of the invention are achieved in a method, such as described above, in which metal contacts of small area are arranged in the form of a raster pattern and alloyed, at an increased temperature, onto the surface of the semiconductor which is to be contacted, with the total of the surface areas of all the metal contacts being so proportioned that it is small in relation to the surface of the semiconductor body. The semiconductor body surface, provided with such metal contacts, is then secured to the metallic heat sink by means of an electrically and thermally conductive adhesive layer.

The invention is based on the recognition that an adhesive layer which is, for example, in the form of a metallic solder having a low melting point, may be satisfactorily employed as an ohmic electrical contact if ohmic metallic contacts have already been alloyed at high temperatures, at points on the surface of the semiconductor, with the alloying temperature for the solder being maintained sufficiently low to prevent any considerable quantities of the semiconductor material from dissolving in the solder, so that the surface of the semiconductor is not dissolved or impaired. If additionally the adhesive layer is composed of material which changes its volume only slightly on solidification, the adhesive layer, in cooled state, will remain in direct contact with the semiconductor surface so that heat can be discharged over such surfaces in a direction towards the heat sink.

BRIEF DESCRIPTION OF THE DRAWING

The FIGURE of the drawing illustrates a sectional view of a luminescence diode constructed in accordance with the method of the invention.

DETAILED DESCRIPTION OF THE INVENTION

Referring to the drawing, the reference numeral 1 designates a semiconductor body, the surface 2 of which is to be alloyed onto a heat sink 3 which may, for example, be constructed of copper. The pn-junction of the semiconductor body is designated by the reference numeral 11. Contacts 41, 42, and 43 composed, for example of an eutectic alloy of gold and germanium are alloyed at desired locations on the surface 2 at a temperature of approximately 500°C. Thereafter a thin layer 5 of an eutectic gold tin alloy is applied by vapour deposition to the surface 2 and contacts 41, 42, and 43. The semiconductor body 1 is then alloyed onto the heat sink 3 at a temperature of approximately 200°C.

The total area of the faces of the individual contacts comprises between 5% and 20% of the surface area 2 of the semiconductor body. An alloy of gold and tin with eutectic composition is particularly suitable as the material for the adhesive layer and when such composition is employed there resulted a low heat resistance to transition of heat from the semiconductor body 1 to the heat sink 3, so that the adhesive layer forms an excellent contact with the surface 2 and with the heat sink.

In accordance with another feature of the method of the invention, the adhesive layer 5, illustrated in the figure, may consist of an electrically conductive epoxide resin adhesive which is hardened at at temperature of around 100°C. Electrical conductivity of the epoxide resin is achieved by mixing therewith a very fine metallic power, for example of copper or tin.

Having thus described my invention it will be obvious that although various minor modifications might be suggested by those versed in the art, it should be understood that I wish to embody within the scope of the patent granted hereon all such modifications as reasonably, and properly come within the scope of my contribution to the art.

I claim as my invention:

1. A method of producing a low resistance electrical contact, on a semiconductor body of a luminescent diode and which is also suitable for securing such semiconductor body to an electrically conductive body which acts as a heat sink, comprising the steps of alloying at a temperature of approximately 500°C, a plurality of metal contacts, disposed in spaced relation, on the surface of the semiconductor body which is to be contacted, with such metal contacts each having an area which is small with respect to such surface of the semiconductor body, and the contacts, as a whole, having a total area of between 5% and 20% of the corresponding surface area of the semiconductor body, and thereafter securing the surface of the semiconductor body provided with such metal contacts to a metallic heat sink by an electrically and thermally conductive adhesive layer.

2. A method according to claim 1, wherein the adhesive layer comprises a solder which has a low melting point and whose alloying temperature is above a lower limit temperature at which the solder forms an alloy with the metal contacts and the metal of the heat sink, and is below an upper limit temperature at which the semiconductor body does alloy with the solder.

3. A method according to claim 1, wherein such solder comprises an eutectic composition of gold and tin.

4. A method according to claim 1, wherein the adhesive layer is an electrically conductive epoxide resin adhesive.

* * * * *